United States Patent
Pavate et al.

(10) Patent No.: US 9,542,638 B2
(45) Date of Patent: Jan. 10, 2017

(54) RFID TAG AND MICRO CHIP INTEGRATION DESIGN

(71) Applicant: LuxVue Technology Corporation, Santa Clara, CA (US)

(72) Inventors: Vikram Pavate, Foster City, CA (US); Andreas Bibl, Los Altos, CA (US)

(73) Assignee: Apple Inc., Cupertino, CA (US)

(*) Notice: Subject to any disclaimer, the term of this patent is extended or adjusted under 35 U.S.C. 154(b) by 46 days.

(21) Appl. No.: 14/183,427

(22) Filed: Feb. 18, 2014

(65) Prior Publication Data
US 2015/0235121 A1 Aug. 20, 2015

(51) Int. Cl.
G06K 19/06 (2006.01)
G06K 19/077 (2006.01)
H05K 1/02 (2006.01)
H05K 1/16 (2006.01)

(52) U.S. Cl.
CPC ....... G06K 19/07783 (2013.01); *H05K 1/0293* (2013.01); *H05K 1/165* (2013.01); *H05K 2201/10098* (2013.01); *H05K 2203/107* (2013.01); *H05K 2203/175* (2013.01); *Y10T 29/49144* (2015.01); *Y10T 29/53174* (2015.01)

(58) Field of Classification Search
CPC .................. G06K 19/07749; G06K 19/0775
USPC .......... 235/482, 487, 462.46, 472.02
See application file for complete search history.

(56) References Cited

U.S. PATENT DOCUMENTS

| | | |
|---|---|---|
| 3,717,743 A | 2/1973 | Costello |
| 3,935,986 A | 2/1976 | Lattari et al. |
| 5,131,582 A | 7/1992 | Kaplan et al. |
| 5,378,926 A | 1/1995 | Chi et al. |
| 5,435,857 A | 7/1995 | Han et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |

(Continued)

FOREIGN PATENT DOCUMENTS

| | | |
|---|---|---|
| JP | 07-060675 A | 3/1995 |
| JP | 11-142878 | 5/1999 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Daniel St Cyr
(74) *Attorney, Agent, or Firm* — Blakely, Sokoloff, Taylor & Zafman LLP

(57) ABSTRACT

An integrated micro chip, method of integrating a micro chip, and micro chip integration system are described. In an embodiment, a micro chip such as a micro RFID chip or integrated passive device (IPD) is electrostatically transferred and bonded to a conductive pattern including a line break. In an embodiment, the line break is formed by a suitable cutting technique such as laser laser ablation, ion beam etching, or photolithography with chemical etching to accommodate the micro chip.

16 Claims, 11 Drawing Sheets

(56) References Cited

U.S. PATENT DOCUMENTS

| | | | |
|---|---|---|---|
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,585,703 B2 | 9/2009 | Matsumura et al. |
| 7,595,729 B2 | 9/2009 | Ku et al. |
| 7,628,309 B1 | 12/2009 | Erikssen et al. |
| 7,683,786 B2 | 3/2010 | Kaoru |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,426,227 B1 | 4/2013 | Bibl et al. |
| 8,518,204 B2 | 8/2013 | Hu et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0038291 A1 | 2/2006 | Chung et al. |
| 2006/0038725 A1* | 2/2006 | Tikhov et al. ......... 343/700 MS |
| 2006/0055035 A1 | 3/2006 | Lin et al. |
| 2006/0065905 A1 | 3/2006 | Eisert et al. |
| 2006/0071084 A1* | 4/2006 | Detig ............... G06K 19/07749 235/492 |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2008/0048206 A1 | 2/2008 | Lee et al. |
| 2008/0088460 A1* | 4/2008 | Copeland ................. 340/572.7 |
| 2008/0129606 A1* | 6/2008 | Yanagisawa et al. . 343/700 MS |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0091456 A1 | 4/2009 | Takei |
| 2009/0146303 A1 | 6/2009 | Kwon |
| 2009/0284351 A1* | 11/2009 | Rossman et al. ............ 340/10.1 |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0111643 A1* | 5/2010 | Schmidkonz ........... B42C 11/04 412/3 |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0220724 A1 | 9/2011 | Sakama |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0064642 A1 | 3/2012 | Huang et al. |
| 2012/0134065 A1 | 5/2012 | Furuya et al. |
| 2012/0223149 A1* | 9/2012 | Kato ............................ 235/492 |
| 2013/0019996 A1 | 1/2013 | Routledge |
| 2013/0038416 A1 | 2/2013 | Arai et al. |
| 2013/0099229 A1 | 4/2013 | Wakana et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2013/0210194 A1 | 8/2013 | Bibl et al. |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2011-181834 A | 9/2011 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/072372 | 6/2011 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

(56) References Cited

OTHER PUBLICATIONS

Guerre, Roland, et al, "Selective Transfer Technology for Microdevice Distribution" Journal of Microelectromechanical Systems, vol. 17, No. 1, Feb. 2008, pp. 157-165.
Han, Min-Koo, "AM backplane for AMOLED" Proc. of ASID '06, Oct. 8-12, New Delhi, pp. 53-58.
Harris, Jonathan H., "Sintered Aluminum Nitride Ceramics for High-Power Electronic Applications" Journal of the Minerals, Metals and Materials Society, vol. 50, No. 6, Jun. 1998, p. 56.
Horwitz, Chris M., "Electrostatic Chucks: Frequently Asked Questions" Electrogrip, 2006, 10 pgs, accessed at www.electrogrip.com.
Hossick-Schott, Joachim, "Prospects for the ultimate energy density of oxide-based capacitor anodes" Proceedings of CARTS Europe, Barcelona, Spain, 2007, 10 pgs.
Lee, San Youl, et al., "Wafer-level fabrication of GAN-based vertical light-emitting diodes using a multi-functional bonding material system" Semicond. Sci. Technol. 24, 2009, 4 pgs.
"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low-Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.
Andrechak, et al., "Hitachi μ-chip RFID Technology Compatible with Gamma Sterilization" Hitachi © 2008 pp. 1-11.
Chung, Ph.D., Kevin, "Low Cost and Reliable RFID tags for All Frequencies", 2003, pp. 1-18. Web. https://www.avantetech.com/uploads/pdf/Reliable%20RFID.pdf. Feb. 18, 2014.
Desmond, Teo Han Jun, "What is RFID?" Apr. 24, 2009, 4 pages. Web. http://howdydesmond.blogspot.com/2009/04/week-1-journal.html. Jul. 15, 2013.
Laran RFID White paper, "A basic introduction to RFID Technology and its use in the supply chain" Jan. 2004, pp. 1-30.
Monti, et al., "Broad-Band Dipole for RFID Applications" Progress in Electromagnetics Research C, vol. 12, pp. 163-172, 2010.
NXP-RFID, "NXP Releases Ucode 7, a Faster and More Sensitive Chip" RFID Journal, LL., 2013, 6 pgs. Web. http://nxp-rfid.com/nxp-releases-ucode-7-a-faster-and-more-sensitive-chip-2/. Jul. 26, 2013.
Prashant, et al., "Integrated Passive Devices (IPD) Integration with eWLB (Embedded Wafer Level BGA) for High Performance RF Applications" IEEE, 2010 Electronics packaging Technology Conference (EPTC) Proceedings, 5 pgs.
Pristauz, Hugh, "RFID Chip Assembly for 0.1 Cents?" Onboard Technology, Sep. 2006, pp. 46-49.
Routing packets and turning pedals, "RFID Basics!" Feb. 21, 2008, 3 pgs. Web. http://rob.sh/post/8. Feb. 18, 2014.
Siden, et al., "Line Width Limitations of Flexographic- Screen- and Inkjet printed RFID Antennas" IEEE, Antennas and Propagation Society International Symposium, 2007, pp. 1745-1748.
STMicroelectronics, "AN2866 Application note: How to design a 13.56 MHz customized tag antenna" Rev. 1, Jan. 2009, pp. 1-24.
TechCrunch, "Hitachi develops world's smallest RFID chip" Jun. 2, 2009, 1 pg. Web. http://techcrunch.com/2009/06/02/hitachi-develops-worlds-smallest-rfid-chip/. Jul. 12, 2013.

\* cited by examiner

RFID TAG AND MICRO CHIP INTEGRATION DESIGN

BACKGROUND

Field

The present invention relates to integrated micro chip applications. More particularly embodiments of the present invention relate to an RFID tag with an integrated micro chip.

Background Information

Radio frequency identification (RFID) is a manner of identifying objects with a wireless communication protocol. The technology can be used to identify, track, sort or detect a wide variety of objects. An RFID system generally includes an RFID tag and a reader. Passive RFID tags include an integrated circuit or chip and an antenna, and are powered by an electromagnetic field provided by the reader. The available power from the reader reduces rapidly with distance and is generally regulated resulting in limited communication distances up to several meters. Passive RFID tags can be operated over the entire frequency range available to RFID systems including low frequency (LF; <300 kHz; 125 kHz primary frequency), high frequency (HF; 3 MHz-30 MHz; primary frequency 13.56 MHz), ultra-high frequency (UHF; 860 MHz-950 MHz; 915 MHz primary frequency in United States, 950 MHz primary frequency in Japan, 868 MHz primary frequency in Europe), and microwave (2.45 GHz-5.8 GHz; 5.8 GHz primary frequency). Active RFID tags include an integrated circuit or chip, an antenna, and a built-in power supply, such as a battery or solar cell to provide voltage to the chip. As a result the electric field detected by the antenna can be much weaker than the electric field that would be required to power a passive RFID tag. This allows communication with the reader at distances of over several kilometers. Active RFID tags most often are operated at the UHF and microwave frequencies.

A variety of characteristics are used to characterize RFID tags such as their capability to read and write data, memory capacity, operating frequency, operating range (distance), and security requirements. At the low-end spectrum of RFID tag functionality, are included read-only passive RFID tags that store a small amount of data. At the high-end spectrum of RFID tag functionality, are included read-write active RFID tags that may additionally include a microprocessor to facilitate more complex logic.

RFID tags generally receive energy and communicate with the reader using two methods. In one manner, the RFID tag communicates with the reader using magnetic field, also termed near field, inductive coupling in which the tag inductively couples to the magnetic field circulating around the reader antenna. The RFID tag associated with near field inductive coupling often includes a coiled antenna that operates at the LF or HF frequencies. A typical read range for passive RFID tags with LF and HF antennas is less than 0.5 meters and approximately 1 meter, respectively. In another manner, the RFID tag couples to the electric field, also termed far field, of the reader and communicates to the reader using backscatter. The RFID tag associated with far field coupling often includes a dipolar antenna that operates at the UHF or microwave frequencies. A typical read range for passive RFID tags with UHF and microwave antennas is approximately 4-5 meters and approximately 1 meter, respectively.

Other related characteristics of RFID tags are cost and reliability. The type of materials and assembly methods used to package RFID tags impact the final cost, and to some extent their performance. A typical RFID tag assembly process includes forming a conductive antenna on a substrate, connecting the chip to the antenna, and forming a protective overlay material over the antenna and chip. Chip connection is typically performed using wire bonding, flip chip, or cut clamp technology (CCT). The protective overlay is typically a polyvinyl chloride (PVC) lamination, epoxy resin, or adhesive. Chip size is also a factor in overall cost.

SUMMARY OF THE INVENTION

Embodiments of the invention describe integrated micro chip applications. In an embodiment, an RFID tag includes a substrate, a conductive antenna pattern, and a micro RFID chip. The antenna pattern includes an antenna feed line that connects two terminal ends of the antenna pattern. A line break having a maximum width of 300 µm or less is formed in the antenna line, and the micro RFID chip is bonded to the antenna feed line on opposite sides of the line break. In an embodiment, the micro RFID chip has a maximum length and width of 300 µm or less, such as 100 µm or less, or 20 µm or less. The conductive antenna pattern may be formed of a variety of materials such as, but not limited to, aluminum or copper.

In accordance with embodiments of the invention, the area of the micro RFID chip can be reduced by using lower technology modes for logic, for example, below 0.180 µm. Reduction of size of the micro RFID chip may also reduce stress. In an embodiment, an underfill encapsulation is not located between the antenna pattern and the micro RFID chip. In an embodiment, a stand-off bond pad height separating the micro RFID chip and antenna feed line is less than 50 µm, such as 3 µm or less.

In an embodiment, a method of integrating a micro chip includes cutting a conductive pattern on a substrate to form a line in the conductive pattern, electrostatically transferring a micro chip to the conductive pattern, and bonding the micro chip to the conductive pattern on opposite sides of the line break. For example, the micro chip may have a maximum length and width of 300 µm or less. Similarly, the line break may have a maximum width of 300 µm or less. In an embodiment, cutting the conductive pattern is performed by laser ablation. The integration scheme may be utilized for a variety of micro chip applications. In one embodiment, the micro chip is a micro RFID chip, and the conductive pattern includes an antenna such as a dipole antenna or a looped antenna. The integration scheme may additionally include electrostatically transferring a micro LED device to the conductive pattern, where the conductive pattern additionally includes an electrode trace line. In one embodiment, the micro chip is an integrated passive device (IPD). In such an embodiment, the IPD chip may include a plurality of integrated passive devices, and less than all of the integrated passive devices have an electrically active connection with the conductive pattern. In this manner the conductive pattern may be a generic interconnection pattern that is cut to achieve a tailored application where the cuts determine which passive devices are to be used. In an embodiment, a bonding pad on a bottom surface of the micro chip is bonded directly to the conductive pattern. In an embodiment, a bonding pad, such as a solder bonding pad, is located between the micro chip and the conductive pattern to facilitate bonding.

In an embodiment, a micro chip integration system includes a pair of rollers, a laser cutting device, and an electrostatic transfer tool including an array of electrostatic transfer heads. The system may additionally include a carrier substrate holder for holding a carrier substrate supporting an array of micro chips. In an embodiment, the system includes a second electrostatic transfer tool including a second array of electrostatic transfer heads. The system may additionally include a second carrier substrate holder for holding a second carrier substrate supporting an array of micro LED devices.

DETAILED DESCRIPTION OF THE INVENTION

Figure 1:
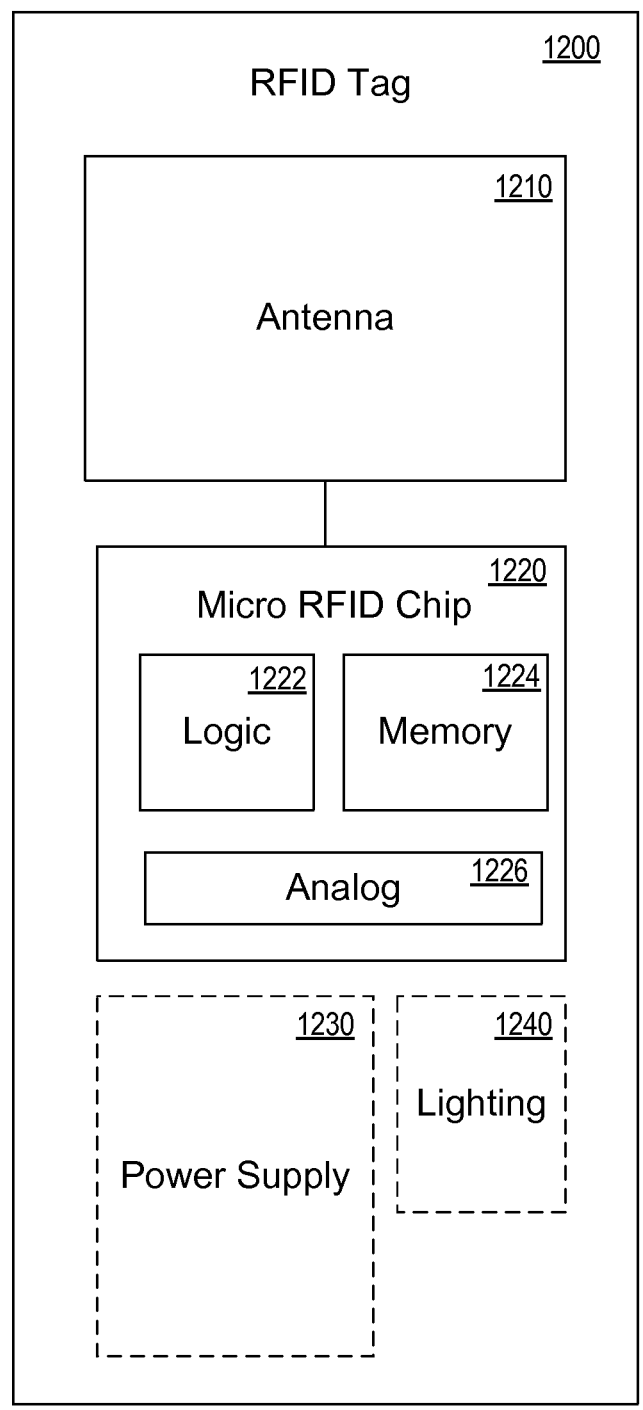
FIG. 1 is a schematic illustration of an RFID tag in accordance with an embodiment of the invention.

Embodiments of the present invention describe designs and systems for integrating micro chips. In an embodiment a micro chip is bonded to opposite sides of a line break in a conductive pattern. In some embodiments, the conductive pattern is formed on a substrate, followed by cutting (for example, by laser ablation), which is followed by electrostatic transfer and bonding of the micro chip to the conductive pattern. While some embodiments of the present invention are described with specific regard to micro chips for RFID applications, it is to be appreciated that embodiments of the invention are not so limited and that certain embodiments may also be applicable to other integration designs such as integrated passive device (IPD) chips, MEMS, etc.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning", "over" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments of the invention describe a micro chip integration design in which a micro chip is transferred and bonded to a conductive pattern using an electrostatic transfer head assembly. In accordance with embodiments of the present invention, a pull-in voltage is applied to an electrostatic transfer head in order to generate a grip pressure on a micro chip. It has been observed that it can be difficult to impossible to generate sufficient grip pressure to pick up micro devices with vacuum chucking equipment when micro device sizes are reduced below a specific critical dimension of the vacuum chucking equipment, such as approximately 300 µm or less, or more specifically approximately 100 µm or less. Furthermore, electrostatic transfer heads in accordance with embodiments of the invention can be used to create grip pressures much larger than the 1 atm of pressure associated with vacuum chucking equipment. For example, grip pressures of 2 atm or greater, or even 20 atm or greater may be used in accordance with embodiments of the invention. Accordingly, in one aspect, embodiments of the invention provide the ability to transfer and integrate micro chips into applications in which integration is not possible with current vacuum chucking equipment. In some embodiments, the term "micro" chip, "micro" LED device, or other "micro" structure may refer to the descriptive size, e.g. length or width, of certain devices or structures. In some embodiments, "micro" chips may be on the scale of 1 µm to approximately 300 µm or less, or 100

µm or less in many applications. However, embodiments of the present invention are not necessarily so limited, and certain aspects of the embodiments may be applicable to larger micro devices or structures, and possibly smaller size scales.

In another aspect, embodiments of the invention describe an integration design that enables reduced cost, in which cost savings associated with chip size reduction may be realized along with cost savings associated with the micro chip attachment. In some embodiments, bonding areas are formed by cutting a line break in a metal pattern using a suitable technique such as laser ablation, followed by transfer and bonding of a micro chip using an electrostatic transfer head assembly. This enables a simplified approach for preparing the bonding area. Furthermore, micro RFID chip underfill encapsulation or an overlay may not be required due to the miniaturization of the micro RFID chip and an associated reduction in stress levels at the bonds between the micro RFID chip and the contact areas of the antenna feed lines.

In another aspect, embodiments of the invention enable the inclusion of smaller technology nodes for the logic components of micro RFID chips, allowing for further reduction in size of the micro RFID chips compared to current commercial implementations in which the minimum size of the micro RFID chips may be determined by the ability to integrate the micro RFID chip. For example, in applications where micro RFID chips were previously integrated with vacuum chucking equipment, it may have been required that the micro RFID chips included a minimum length and width of greater than 400 µm in order to be picked up.

By way of illustrative example, an industry standard 128-bit passive RFID chip operating at 2.45 GHz in the far field may have a size of 400 µm square, or 700 µm square. Given an assumption that each subsequent technology node is defined as a 70% reduction in feature size, a 50% area reduction for the logic component of the micro RFID chip would be expected by using a smaller technology node. For the memory component, which can encompass 20% or more of the entire area of the micro RFID chip, the use of alternate memory technologies beyond EEPROM (such as, but not limited to, one time programmable (OTP) memory or laser fuse memory) can further reduce the necessary area. Further area enhancements can be obtained by selecting critical features only, optimizing the micro RFID chip for specific applications. All of the above possibilities, when combined, can result in micro RFID chip 200 µm in size or less in some embodiments, smaller than the minimum requirement for handling by vacuum chucking equipment.

Referring now to FIG. 1, a schematic illustration of a passive RFID tag 1200 is provided in accordance with embodiments of the invention. The RFID tag 1200 may be either active or passive, and may operate in either the near field or far field. The micro RFID chips 1220 associated with both the far field and near field RFID tags may both include a logic block 1222 including transistors of a specific technology node have a specific gate length, a memory block 1224 including transistor of a specific technology node having a specific gate length, and an analog block 1226. The logic block 1222 may perform signal decoding/encoding, power control, and instruction sequencing. The memory block 1224 may include memory devices be writable, one time programmable, or read-only. For example, EEPROM, OTP memory, or laser fuse memory may be used for writable memory. The amount of memory varies, often between 1 bit and 64 kilobytes. The analog block 1226 may perform analog to digital conversion and signal modulation. The analog to digital converter enables the RFID tag to process information by converting a radio frequency signal to a direct-current (DC) power, which may be stored in capacitors of a Schottky detector, for example, that in turn may be used to operate the tag. As RF cycle time increases, capacitor discharge time may increase, and hence the requirement for capacity of the capacitors and size requirement of the capacitors. Accordingly, it is expected that the logic blocks for both near field and far field RFID chips can be scaled similarly with regard to technology nodes, however, the analog block of near field RFID chips may scale differently due to the potential for a larger area requirement of capacitors. As described above, a number of factors may contribute to the scalability of the micro RFID chips, such as the required RFID tag functionality including memory storage capacity and logic capabilities, technology nodes used in manufacturing, operating frequency, and the capability to perform electrostatic transfer and integration of the micro RFID chip.

Still referring to FIG. 1, the RFID tags in accordance with embodiments of the invention can be either active or passive, and may operate in either the near field or far field. Where the RFID tags are active, a power supply 1230 such as a battery or solar cell may be included to provide a voltage to the micro RFID chip 1220. In accordance with some embodiments, a lighting area 1240 may optionally be included in an RFID tag. For example, one or more micro LED devices may be incorporated to provide a visual notification when the RFID tag is interrogated by a reader.

Figure 2:
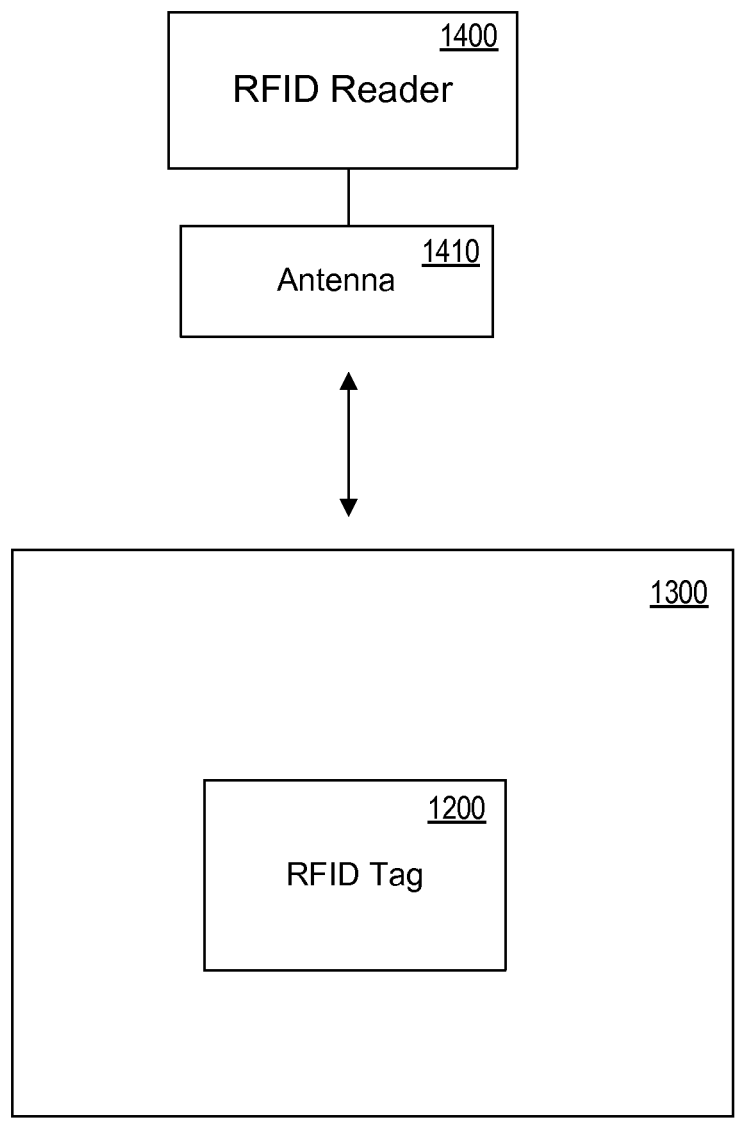
FIG. 2 is a schematic illustration of an RFID system in accordance with an embodiment of the invention.

FIG. 2 is a schematic illustration of an RFID system in accordance with an embodiment of the invention. The RFID system may use electromagnetic energy for power and communication. In an embodiment, the RFID system includes a reader unit 1400, antenna 1410 connected with the reader unit 1400, and an RFID tag 1200. In an embodiment, the RFID tag is coupled to a substrate 1300 such as a printed circuit board (PCB), though the RFID tag may be coupled to a variety of rigid and flexible substrates for a variety of applications. In an embodiment the RFID tag includes a micro RFID chip and an antenna. The RFID tag 1200 antenna receives and transmits signals to the antenna 1410 associated with the reader 1400. The micro RFID chip may perform any of power conversion and control, signal modulation, decoding/encoding, and memory storage. In an embodiment, the RFID tag may receive a signal from the reader, write information contained in the signal to its memory, and send a response signal back to the reader.

Figure 3:
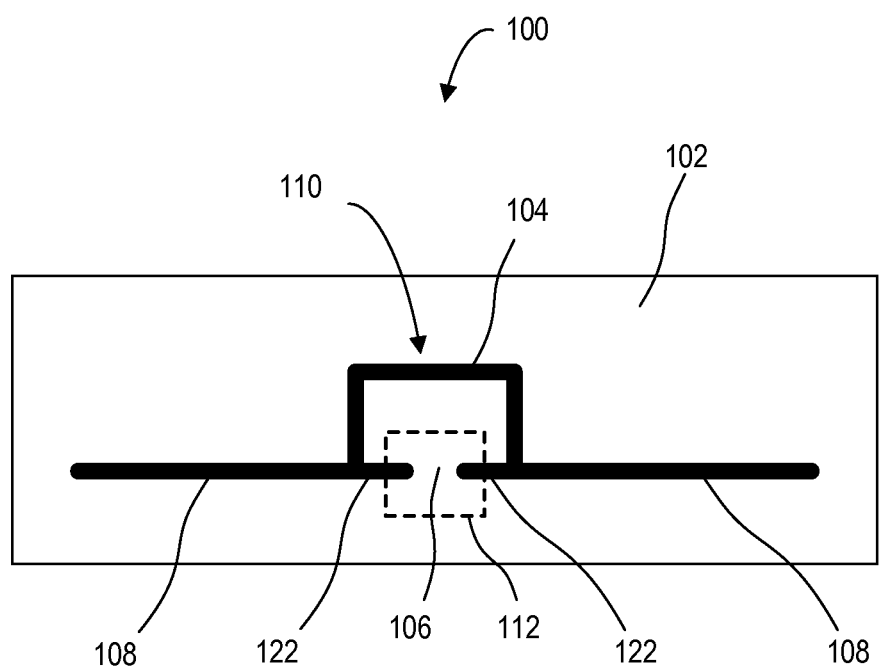
FIG. 3 is a schematic top view illustration of a far field RFID tag including a micro chip bonded to a planar dipole antenna in accordance with an embodiment of the invention.

Referring now to FIG. 3, a schematic top view illustration is provided of a far field RFID tag including a micro RFID chip bonded to a planar dipole antenna in accordance with an embodiment of the invention. For example, the RFID tag illustrated in FIG. 3 may operate at the UHF or microwave frequencies. As illustrated, the RFID tag 100 includes a substrate 102, a dipole antenna 110, and a micro RFID chip 112. The dipole antenna 110 may include a parallel inductor 104, two radiating elements 108, and a line break 106 in an antenna feed line 122 connecting two terminal ends of the two radiating elements 108. In an embodiment, the micro RFID chip 112 is bonded to contact areas of the antenna feed line 122 and spans over the line break 106. The micro RFID chip 112 may function to manage power and enable communication with a reader. The two radiating elements 108 may be symmetrical. In some embodiments the symmetrical radiating elements may be in the form of meandered lines or a mesh. The parallel inductor 104 matches the impedance of the micro RFID chip 112 and the symmetrical radiating elements 108. The inductor 104 may be made with the same material as the radiating elements and is a closed line. In another embodiment, the inductor 104 can be a separately formed element.

Figure 4:
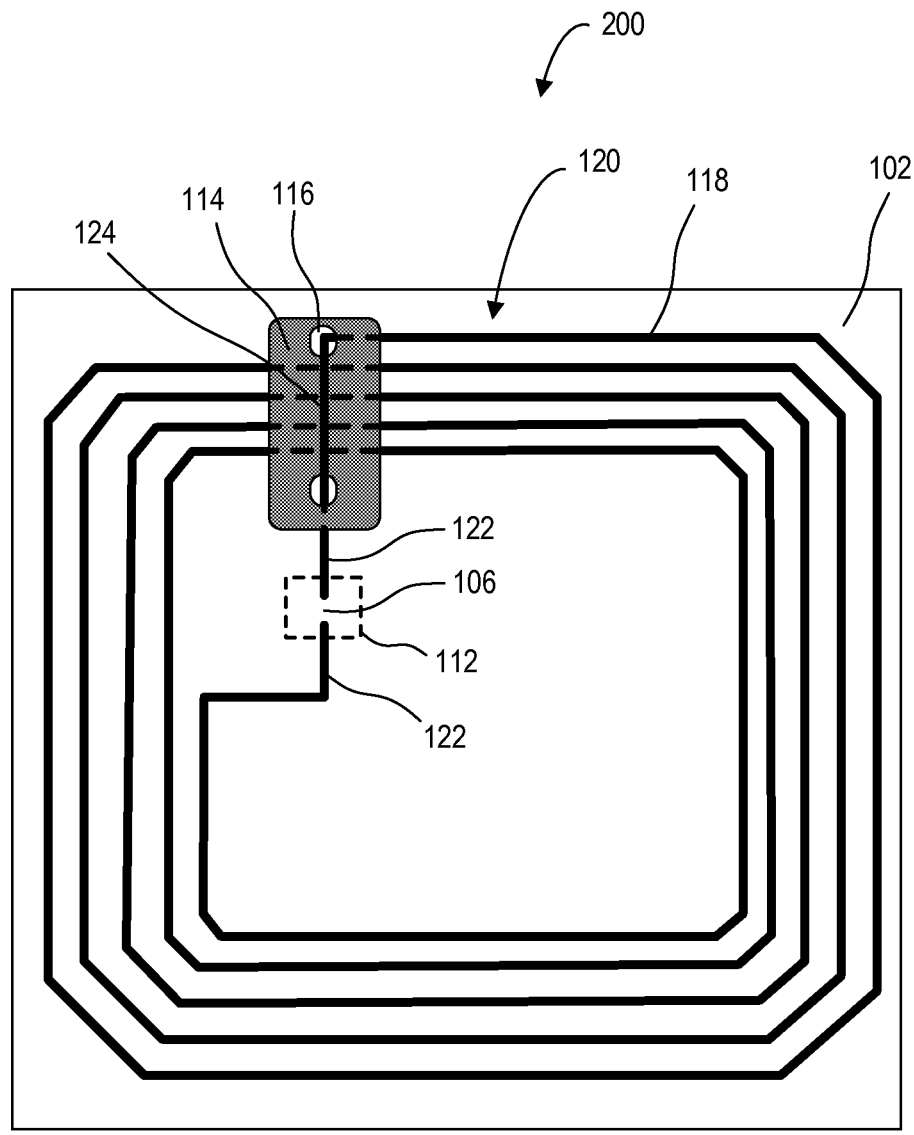
FIG. 4 is a schematic top view illustration of a near field RFID tag including a micro chip bonded to a looped antenna in accordance with an embodiment of the invention.

FIG. 4 is a schematic top view illustration of a near field RFID tag including a micro chip bonded to a looped antenna in accordance with an embodiment of the invention. For example, the RFID tag illustrated in FIG. 4 may operate at the LF or HF frequencies. As illustrated, the RFID tag 200 includes a substrate 102, a looped antenna 120, and a micro RFID chip 112. In an embodiment, an antenna feed line 122 is used to connect the two terminal ends of the looped portion 118 of the looped antenna 120. A line break 106 is formed in the antenna feed line 122 and the micro RFID chip 112 spans over the line break 106 and is connected to contact areas at two separate sides of the cut antenna feed line 122. An insulator layer 114 may be formed over a plurality of loops 118 in the looped antenna 120, followed by the formation of a pair of openings 116 in the insulator layer to contact two terminal ends of the looped antenna 120. A conductive bridge line 124 is then formed over the insulator layer 114 to electrically connect the two terminal ends of the looped antenna 120. It is to be appreciated that a variety of configurations are possible for connecting the terminal ends of a looped antenna, and embodiments of the invention are not limited to the specific embodiment illustrated in FIG. 4. For example, the RFID chip 112 can be bonded to an antenna feed line 122 outside of the plurality of loops 118. Alternatively, the conductive bridge line 124 can be formed underneath the plurality of loops 118. In yet another embodiment, a crimped antenna design can be used to attach terminal ends of the antenna by laminating a conductor on both sides of the substrate 102 and providing a conductive crimp or clamp around edges of the substrate 102 to connect the terminal ends of the antenna. Such a configuration utilizing cut clamp technology (CCT) can eliminate the formation of the insulator layer.

Figure 5:
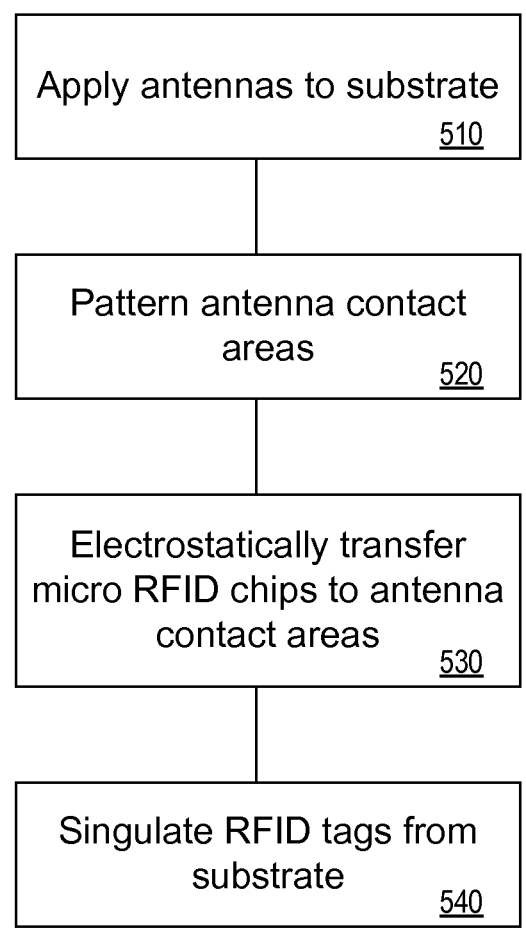
FIG. 5 is an illustration of a method of integrating a micro chip in an RFID tag in accordance with an embodiment of the invention.

The RFID tag 100 illustrated in FIG. 3 and the RFID tag 200 illustrated in FIG. 4 may be formed using similar processing techniques. FIG. 5 is an illustration of a method of integrating a micro RFID chip in an RFID tag in accordance with an embodiment of the invention. One or more antennas are applied to a substrate at block 510, followed by patterning antenna contact areas at block 520, electrostatically transferring micro RFID chips to the antenna contact areas at block 530, and optionally singulating multiple RFID tags from the substrate at block 540.

Substrate 102 is typically an insulator, and may be flexible or rigid. Exemplary flexible materials include polyethylene terephthalate (PET), polypropylene (PP), porous polymer networks (PPN), flexible plastics, glass, and paper. Exemplary rigid materials include printed circuit board (PCB) materials, FR4 grade glass-reinforced epoxy sheets, and glass.

In one embodiment, the antenna patterns 110, 120 are formed on substrate 102 by lamination of a metal layer such as aluminum or copper. Other suitable formations methods may include printing (e.g. screen printing, ink jet printing), metal vapor deposition, etc. Likewise, a metal layer may be formed on the substrate using any suitable technique such as lamination, etc. followed by etching to form the antenna patterns. In an embodiment, following the formation of the antenna 110, 120 a line break 106 is cut into the antenna feed line 122 using a suitable technique such as laser ablation, ion beam etching, or photolithography with chemical etching. Formation of the line break 106 may partly define the contact areas of the antenna feed line 122 for bonding the micro RFID chip 112. While antenna feed lines 122 are illustrated as straight lines, embodiments of the invention are not so limited. In other embodiments, antenna feed lines 122 may be non-linear, or may include enlarged contact areas, amongst other possible patterns.

Referring again to FIG. 3, in an exemplary embodiment a dipole antenna 110 is formed of a metal line pattern having a thickness of greater than 3 μm, or more specifically 6 μm-8 μm, with an approximately 100 μm wide line width forming any or all of the radiating elements 108, antenna feed line 122, and inductor 104. As described above, radiating elements 108 are not limited to straight lines and may take other configurations such as, but not limited to, meandered lines or a mesh.

Referring to FIG. 4, in an exemplary embodiment a looped antenna 110 is formed of a metal line pattern having a thickness of approximately 30 μm, with a line width of approximately 100 μm, and spacing between lines in the looped portion 118 of approximately 100 μm. A number of looped configurations are possible. In an embodiment, there are 6-8 loops. Loops are not limited to rectangular, and may be circular or any suitable shape. In an embodiment, the insulator layer 114 is formed by screen printing. Openings 116 may be formed as a result of the screen printing process, or may be etched into insulator layer 114. Following the formation of the insulator layer 114 and openings, conductive bridge line 124 is formed. In an embodiment, conductive bridge line 124 is formed by screen printing. In an embodiment, conductive bridge line 124 is formed by screen printing a trace line followed by electroplating on top of the trace.

Figure 6A:
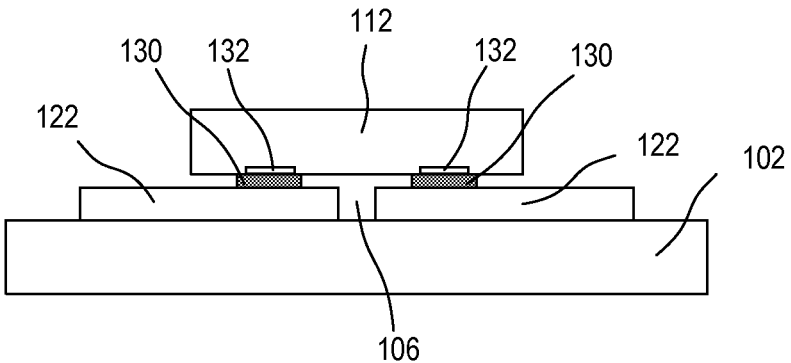
FIG. 6A is a cross-sectional side view illustration of an RFID tag including a micro chip bonded to conductive antenna pattern on opposite sides of a line break in the antenna pattern in accordance with an embodiment of the invention.

In accordance with embodiments of the invention, the width of the line break 106 separating the antenna feed line 122 need only be wide enough, e.g. 1 μm, to provide electrical insulation across the cut line. FIG. 6A is a cross-sectional side view illustration of an RFID tag including a micro chip bonded to conductive antenna pattern on opposite sides of a line break in the antenna pattern in accordance with an embodiment of the invention. In the embodiment illustrated in FIG. 6A, a minimum width of the line break 106 is the width required to provide insulation across the cut line, and the maximum line width of the line break 106 must be less than the minimum width of the micro RFID chip 112. As described above, embodiments of the invention describe a micro chip integration design in which a micro chip is transferred and bonded to a conductive pattern using an electrostatic transfer head assembly. Use of the electrostatic transfer head assembly, in turn allows for the inclusion of smaller technology nodes for the logic components of micro chips, and the use of memory technologies beyond EEPROM, allowing for further reduction in size of the micro chips compared to current commercial implementation in which the minimum size of the micro chips may be determined by the ability to integrate the micro chip. For example, in applications where micro RFID chips were previously integrated with vacuum chucking equipment, it may have been required that the micro RFID chips included a minimum length and width greater than 400 μm in order to be picked up. In accordance with embodiments of the invention, the maximum width of the micro RFID chips 112 being transferred and bonded to the RFID tags may be approximately 300 μm or less, or 100 μm or less in many applications. Accordingly, in some embodiments, the width of the line break 106 may be 1 μm-300 μm, or 1 μm-100 μm. In an embodiment particularly illustrating the scalability of the micro RFID chip 112, the maximum width of the micro RFID chip 112 is 1 μm-20 μm and the width of the line break 106 may be 1 µm-20 µm, where the width of the line break 106 is less than the maximum width of the micro RFID chip 112.

Still referring to FIG. 6A, as illustrated, in an embodiment a micro RFID chip 112 including bonding pads 130 may be electrostatically transferred and bonded to contact areas of the cut antenna feed line 122. In another embodiment, bonding pads 130 can be formed on contact areas antenna feed line 122 prior to electrostatically transferring the micro RFID chip 112. Bonding pads 130 may be formed prior to or after cutting the antenna feed line 122. In an embodiment, bonding pads 130 are formed prior to cutting the antenna feed line 122, which may increase automation of the process, for example roll-to-roll processing. Bonding pads 130 may provide an electrical connection between the cut antenna feed line 122 and input/output pads 132 of the micro RFID chip 112. In an embodiment heat is applied from the electrostatic transfer head assembly to cause eutectic alloy bonding, transient liquid phase bonding, or solid state diffusion bonding with the cut antenna feed line 122. In an embodiment, the micro RFID chip 112 is solder bonded to the cut antenna feed line 122 with solder bonding pads 130.

In an embodiment, bonding pad 130 material is selected for its ability to diffuse with antenna feed line 122 or another bonding layer formed on the antenna feed line. Referring back to operation 530 in FIG. 5, the electrostatic transfer head assembly may also be used to bond the micro RFID chip 112 to the cut antenna feed line 122. In such an embodiment thermal and/or acoustic energy may be transferred from the electrostatic transfer head assembly and through the array of micro RFID chips 112 to bond the array of micro RFID chips to the cut antenna feed line 122. In an embodiment, the transfer of thermal and/or acoustic energy is accompanied by the application of pressure from the electrostatic transfer head assembly.

In accordance with some embodiments the stand-off height of the bond pads 130 separating the micro RFID chip 112 from the antenna feed line 122 is significantly less than a typical stand-off height associated with flip chip bump packaging, which may typically be at least 50 µm-80 µm in order to accommodate an underfill encapsulation material to assist in bonding and reducing stress in solder joints. In accordance with some embodiments of the invention an underfill encapsulation material is not necessary to assist with bonding, and the stress in the bond pads 130 is significantly less than with typical flip chip packaging. Removing the requirement for an underfill material may additionally save cost and time associated with including an underfill and cure station in the packaging process. The reduction in stress may be associated with factors such as reduced dimensions of the micro RFID chip 112 area, as well as reduced stand-off height of the bond pads 130. In some embodiments, the bond pads 130 have a height less than 50 µm, less than 10 µm, or more specifically less than approximately 3 µm. In some embodiments, only a sufficient amount of bond pad 130 material is required to form an alloy bond such as an intermetallic compound or eutectic alloy with the antenna feed line 122, or another bonding layer on the antenna feed line. In some embodiments, only a sufficient amount of bond pad 130 material is required to form an alloy bond such as an intermetallic compound or eutectic alloy with the input/output pads 132. In some embodiments, bond pad 130 forms a solder bond. In a specific embodiment that illustrates the scalability of the micro RFID chip, the micro RFID chip 112 has a thickness of approximately 1 µm-20 µm, a width of approximately 1 µm-300 µm, 1 µm-100 µm, or 10 µm-20 µm, and a bond pad 130 height of approximately 3 µm or less. At these sizes, the amount of stress is significantly reduced across the bond pads 130. Accordingly, in accordance with some embodiments of the invention, an underfill encapsulation material is not applied below the micro RFID chip 112. Furthermore, in accordance with some embodiments an overlay protective material is not required to be formed over the micro RFID chip 112. In an embodiment, the bond pad 130 is formed of gold, and the antenna feed line 122 is formed of aluminum, though a number of other material selections are possible. In another embodiment, a bonding pad material is formed on the contact areas of the antenna feed lines 122 prior to bonding the micro RFID chips 112. In an embodiment, the bonding pad material is a solder material such as indium, tin, bismuth, or alloys thereof.

Figure 6B:
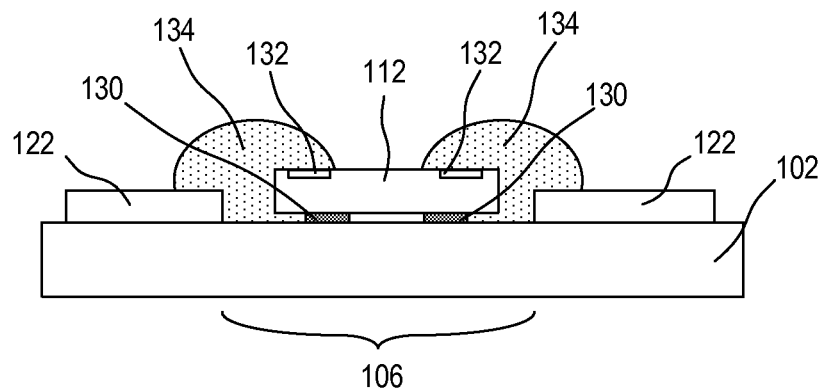
FIGS. 6B-6C are cross-sectional side view illustrations of an RFID tag including a micro chip bonded within a line break in the antenna pattern in accordance with embodiments of the invention.
Figure 6C:
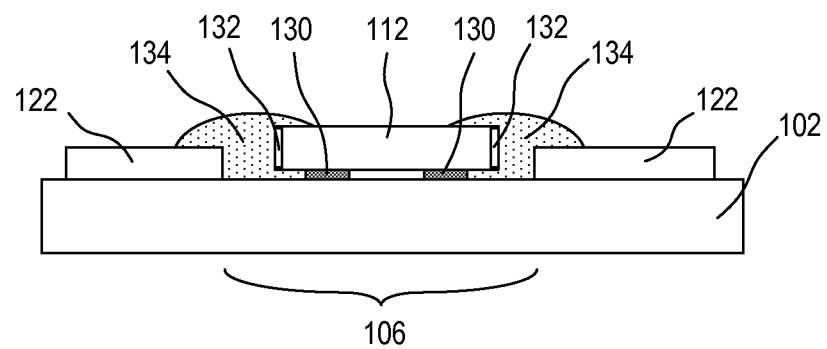

Referring now to FIGS. 6B-6C, cross-sectional side view illustrations are provided of an RFID tag including a micro chip bonded within a line break in the antenna pattern in accordance with embodiments of the invention. While the line break 106 described and illustrated above with regard to FIG. 6A is narrower than a width of the micro RFID chip 112, embodiments of the invention do not require such a configuration. As illustrated in FIGS. 6B-6C, the micro RFID chip 112 may be bonded to the substrate 102 within the line break 106. For example, solder bonding pads 130 may be used to bond the micro RFID chip 112 to the substrate. Solder bonding pads 130 may be formed either on the micro RFID chip 112 or substrate 102, or both, prior to the electrostatic transfer process. However, if an electrical connection is not required of the bonding pads 130, and any suitable adhesive bonding material may be used, such as an insulating polymer.

Following the electrostatic transfer and bonding of the micro RFID chip 112, an electrically conductive layer 134 may be formed to make electrical connection with input/output pads 132 of the micro RFID chip 112 and the cut antenna feed line 122. For example, conductive layer 134 may be printed using a suitable technique such as screen printing or ink jet printing.

Exemplary materials for the conductive layer 134 include, but are not limited to, solder, amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment, the conductive layer 134 is formed by ink jet printing or screen printing. Conductive layer 134 may additionally aid in adhering the micro RFID chip 112 to the substrate 102.

Figure 7A:
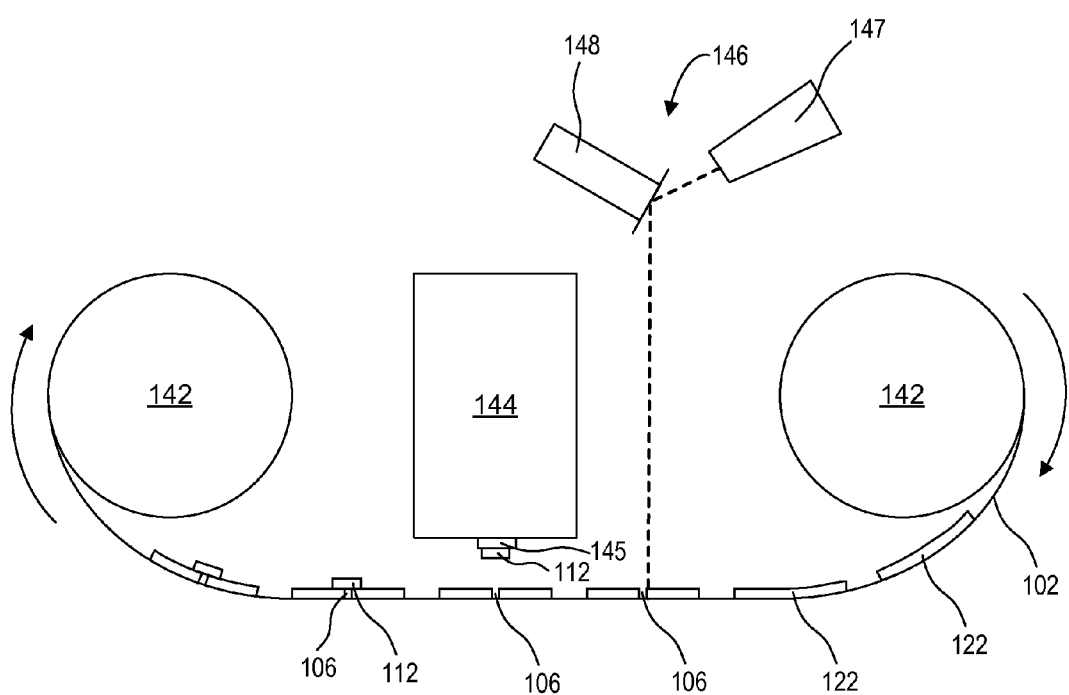
FIG. 7A is a schematic side view illustration of an automated integration system in accordance with an embodiment of the invention.

FIG. 7A is a schematic side view illustration of an automated integration system in accordance with an embodiment of the invention. As shown in FIG. 7A, the integration system can be a roll-to-roll manufacturing system including a pair of rollers 142. Substrate 102 may be a flexible substrate including a plurality of antennas 110, 120. In interest of clarity, only a plurality of separate antenna feed lines 122 are illustrated in the side view illustration in FIG. 7A.

As the flexible substrate 102 is moved between rollers 142, a cutting assembly 146 is used to cut a line break 106 in each separate antenna feed line 122. For example, line breaks 106 may be formed in an array of separate antenna feed lines 122. In an embodiment, a cutting assembly 146 includes a laser 147, for example an excimer laser, fiber laser, or solid state laser, which is focused and directed by optical lenses and mirrors 148.

Following the formation of a line break 106, an electrostatic transfer head assembly 144 including one or more electrostatic transfer heads 145 is used to transfer one more micro RFID chips 112 to the one or more cut antenna feed lines 122. In accordance with embodiments of the invention, an array of micro RFID chips 112 are simultaneously transferred from a carrier substrate to substrate 102 and bonded to a corresponding array of cut antenna feed lines 122.

Figure 7B:
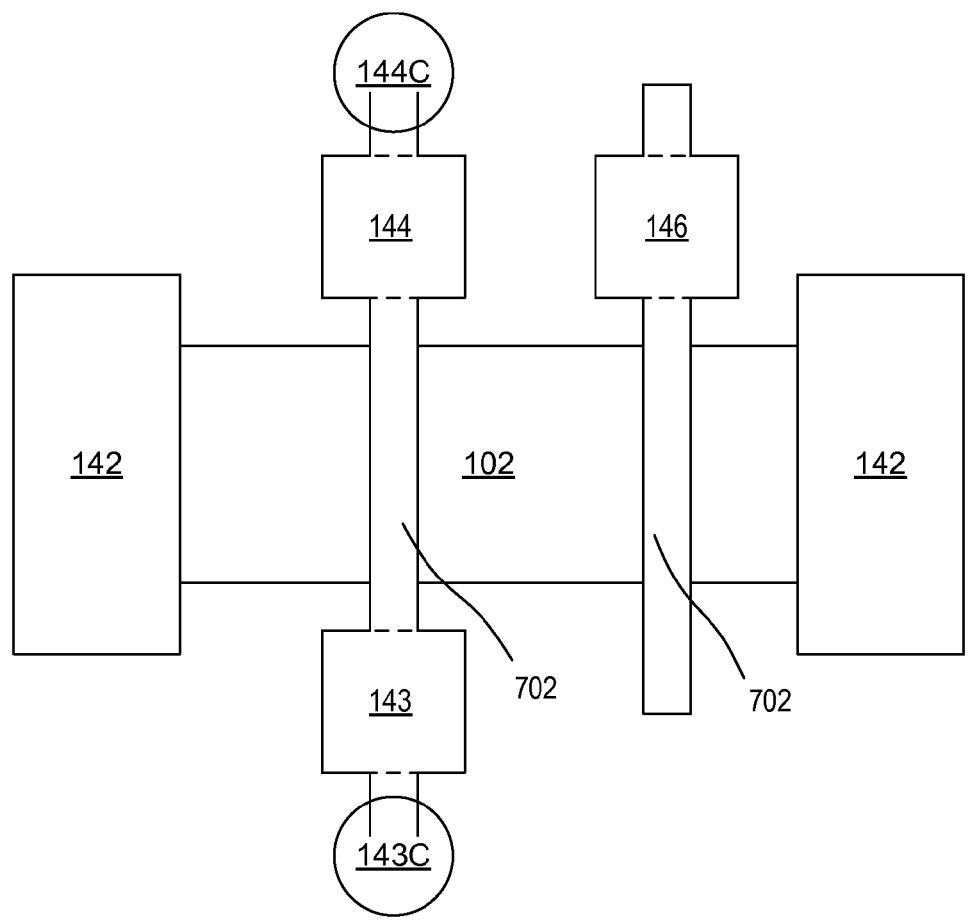
FIG. 7B is a schematic top view illustration of an automated integration system in accordance with an embodiment of the invention.

In accordance with some embodiments, one or more electrostatic transfer head assemblies 144 can be used to transfer and integrate additional micro devices on an RFID tag. For example, one or more separate electrostatic transfer head assemblies can be included in an automated integration system to also integrate one or more micro LED devices in addition to a micro RFID chip. FIG. 7B is a schematic top view illustration of an automated integration system in accordance with an embodiment of the invention. As shown substrate 102 is moved between rollers 142. A cutting assembly is movable over the substrate 102 to cut line breaks in the antenna feed lines. The cutting assembly may additionally cut line breaks in an optional electrode trace line. Additionally, the cutting assembly may cut line breaks separating the antenna feed lines from electrode trace lines. As shown in FIG. 7B, the cutting assembly 146 may be coupled with a carriage 702 that allows movement of the cutting assembly 146 over the substrate 102 to form the appropriate line breaks. The cutting assembly 146 may be movable about a variety of axes along the carriage. For example, cutting assembly 146 may be movable along any of the x-axis, y-axis, z-axis, and may be rotatable about an angle. An electrostatic transfer head assembly 144 may additionally be coupled with a carriage 702, which may be same or different carriage to which the cutting assembly 146 is coupled with. The electrostatic transfer head assembly 144 may also be movable along a variety of axes, or rotatable about an angle as previously described. As shown the electrostatic transfer head assembly 144 may be movable between a carrier substrate holder 144C for holding a carrier substrate supporting an array of micro chips (e.g. RFID chips or IPD chips), and the substrate 102. A separate electrostatic transfer head assembly 143 may optionally be coupled with a carriage 702, which may be the same or different from carriages describe above. The electrostatic transfer head assembly 143 may also be movable along a variety of axes, or rotatable about an angle as previously described. As shown the electrostatic transfer head assembly 143 may be movable between a carrier substrate holder 143C for holding a carrier substrate supporting an array of micro LED devices, and the substrate 102.

Figure 8A:
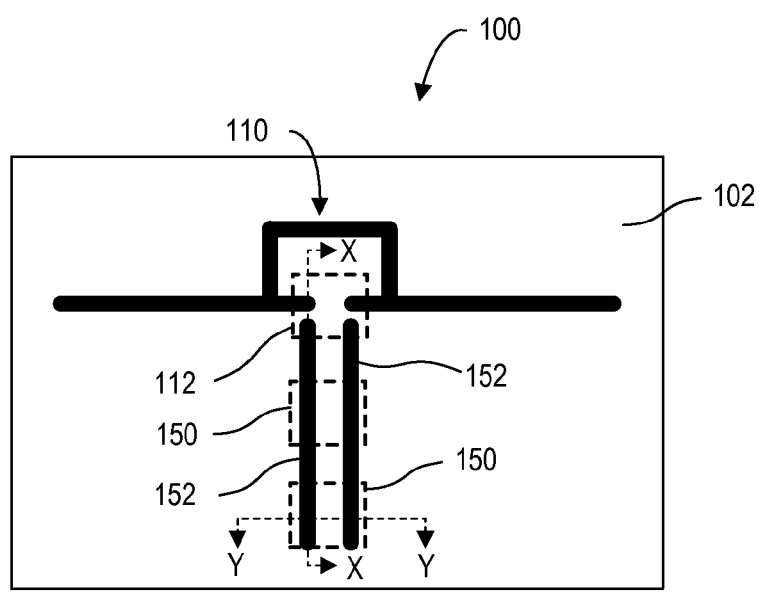
FIG. 8A is a schematic top view illustration of a far field RFID tag including a micro RFID chip and a pair of micro LED devices connected to a planar dipole antenna in accordance with an embodiment of the invention.
Figure 8B:
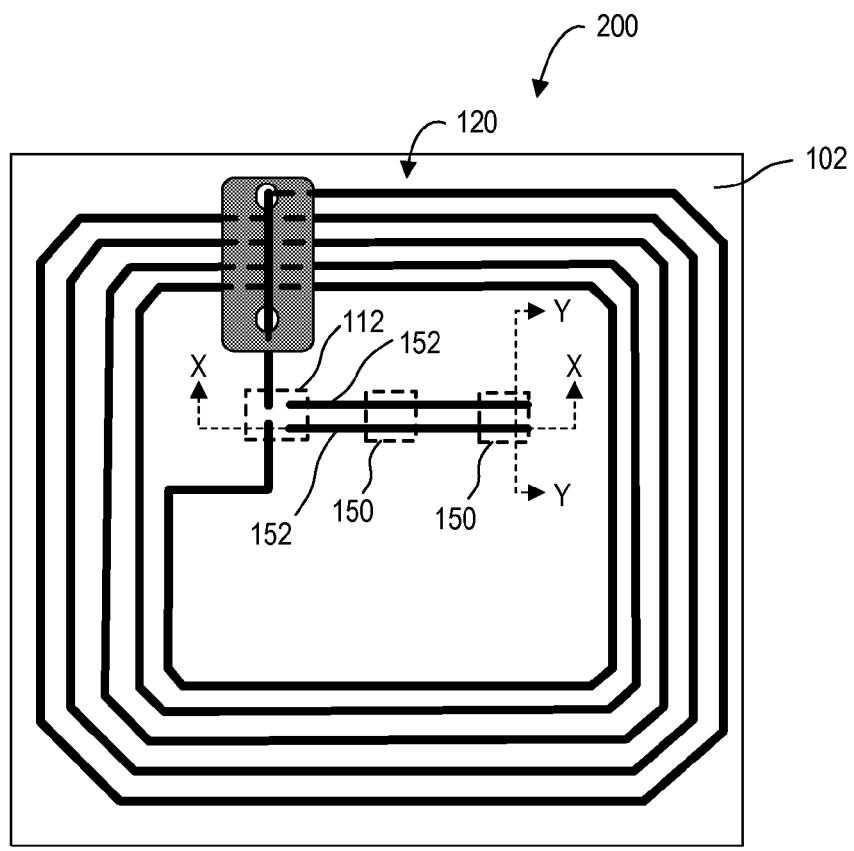
FIG. 8B is a schematic top view illustration of a near field RFID tag including a micro RFID chip and a pair of micro LED devices connected to a looped antenna in accordance with an embodiment of the invention.

FIG. 8A is a schematic top view illustration of a far field RFID tag including a micro RFID chip and a pair of micro LED devices connected to a planar dipole antenna in accordance with an embodiment of the invention. FIG. 8B is a schematic top view illustration of a near field RFID tag including a micro RFID chip and a pair of micro LED devices connected to a looped antenna in accordance with an embodiment of the invention. In the particular embodiments illustrated, one or more electrode trace lines 152 can be formed on the substrate 102 similarly as the antenna patterns 110, 120. One or more micro LED devices 150 are transferred and bonded to contact areas of the electrode trace lines 152 using one or more electrostatic transfer head assemblies. In this manner, the one or more micro LED devices connected with the micro RFID chip can light up when the RFID tag is interrogated by a reader. Accordingly, such a configuration could be used in an application where the RFID tag lights up making it easier to find an object.

Electrode trace lines 152 can be formed in a similar manner to antenna patterns described above. Electrode trace lines 152 can be formed at the same time as the antenna, and required line breaks, for instance to separate one formed line into two separate electrode trace lines, can be formed by laser ablation, ion beam etching, or photolithography with chemical etching. In an embodiment, line breaks are additionally formed (e.g. laser ablation, etc.) to separate the electrode trace lines 152 from the antenna pattern, such as from the antenna feed lines 122.

Figure 9A:
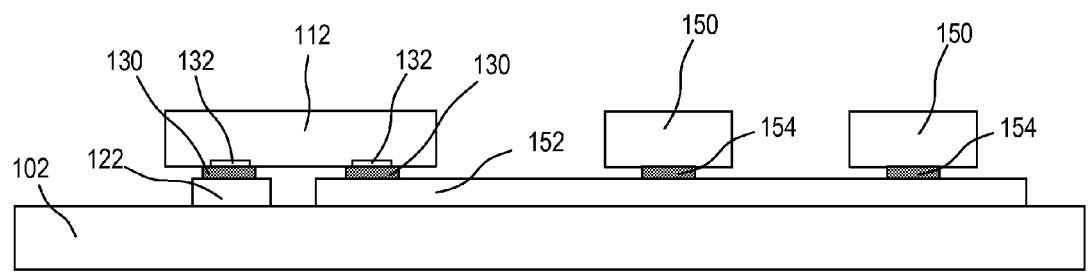
FIG. 9A is a cross-sectional side view illustration taken along line X-X of FIG. 8A or FIG. 8B in accordance with an embodiment of the invention.

FIG. 9A is a cross-sectional side view illustration taken along line X-X of FIG. 8A or FIG. 8B in accordance with an embodiment of the invention. As illustrated, the micro RFID chip 112 is bonded to contact areas on both the antenna feed lines 122 and electrode trace lines 152. Bonding pads 130 may provide an electrical connection between the cut antenna feed line 122 and input/output pads 132 of the micro RFID chip 112, as well as an electrical connection between the electrode trace lines 152 and input/output pads 132 of the micro RFID chip. Bonding pads 154 may be used to bond the micro LED devices 150 to contact areas of the electrode trace lines 152 similarly as with the micro RFID chips. Bonding pads 154 may be formed of the same or different material than bonding pads 130.

Figure 9B:
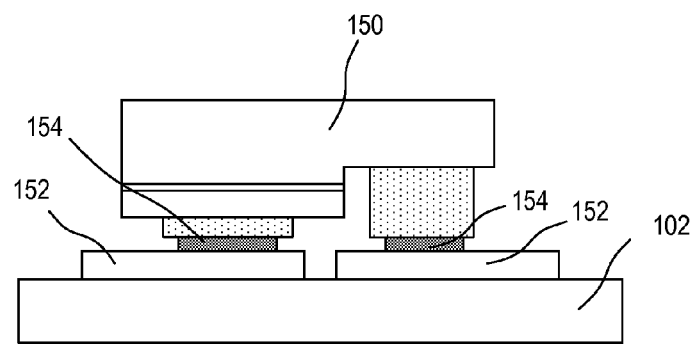
FIG. 9B is a cross-sectional side view illustration taken along line Y-Y of FIG. 8A or FIG. 8B incorporating a horizontal micro LED device in accordance with an embodiment of the invention.
Figure 9C:
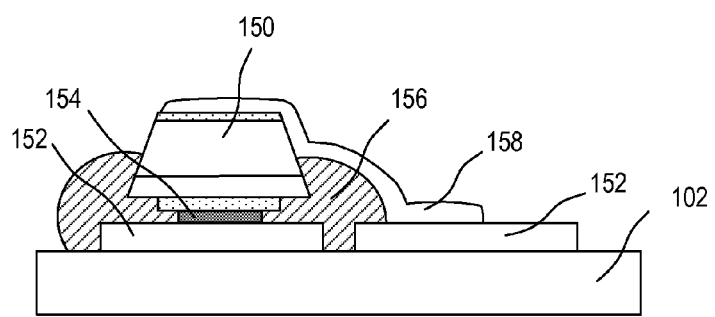
FIG. 9C is a cross-sectional side view illustration including a vertical micro LED device formed over and bonded to a contact area of a single electrode trace line in accordance with an embodiment of the invention

Referring now to FIG. 9B, a cross-sectional side view illustration taken along line Y-Y of FIG. 8A or FIG. 8B is shown incorporating a horizontal micro LED device 150 in accordance with an embodiment of the invention. In such an embodiment, the horizontal micro LED device 150 includes contacts on the same side of the device. In such an embodiment, the horizontal micro LED device 150 spans across both electrode trace lines 152, and is bonded to both electrode trace lines 152 with bonding pads 154. FIG. 9C, is a cross-sectional side view illustration similar to that in FIG. 9B, with a vertical micro LED device 150 formed over and bonded to a contact area of a single electrode trace line 152 in accordance with an embodiment of the invention. Bonding the vertical micro LED device to an electrode trace line may be followed by forming an insulating layer 156 around the vertical micro LED device 150, followed by the formation of a top electrode layer 158 that spans from a top contact of the vertical micro LED device 150 to the other electrode trace line 152. The insulating layer 156 may function to prevent electrical shorting of the top electrode layer 158. The insulating layer 156 may additionally be used to passivate sidewalls of the micro LED device 150 and protect a quantum well layer(s) in the micro LED device. Such an insulating layer 156 may likewise be used to protect a quantum well layer(s) for a horizontal micro LED device. Exemplary materials that may be used for insulating layer 156 include, but are not limited to, glass, epoxy, poly(methyl methacrylate) (PMMA), benzocyclobutene (BCB), polyimide, and polyester. In an embodiment, insulating layer 156 is formed by ink jet printing around the micro LED device 150. Exemplary materials for the top electrode layer 158 include, but are not limited to, amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment, the insulating layer 156 and top electrode layer 158 are formed by ink jet printing or screen printing.

Referring now to FIGS. 10A-10D, schematic illustrations are provided for manners of integrating passive device components on a printed circuit board in accordance with an embodiment of the invention. Integrated passive devices (IPD) or integrated passive components (IPC) are attracting interest particularly in wireless communications devices as an advanced packaging solution with small form factor, reliable interconnection, and at low cost. An IPD chip in accordance with embodiments of the invention may have only passive devices, or a combination of passive and active devices. Exemplary passive devices include capacitors, resistors, inductors, and diodes. Many functional blocks such as impedance matching circuits, harmonic filters, couplers and baluns and power combiner/divider can be realized by IPD technology.

Figure 10A:
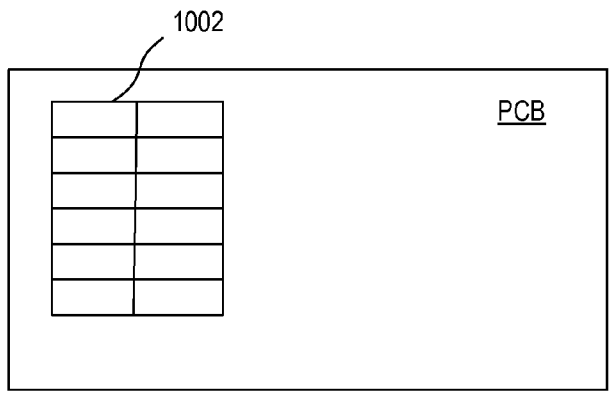
FIGS. 10A-10D are schematic illustrations of manners for integrating passive device components on a printed circuit board in accordance with an embodiment of the invention.
Figure 10B:
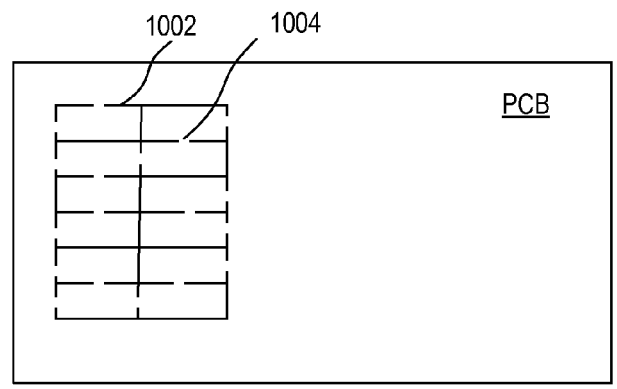
Figure 10C:
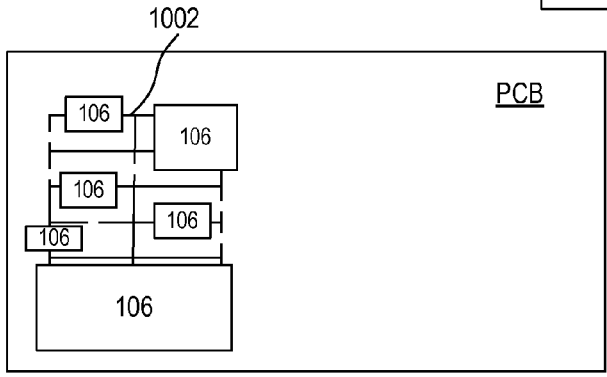
Figure 10D:
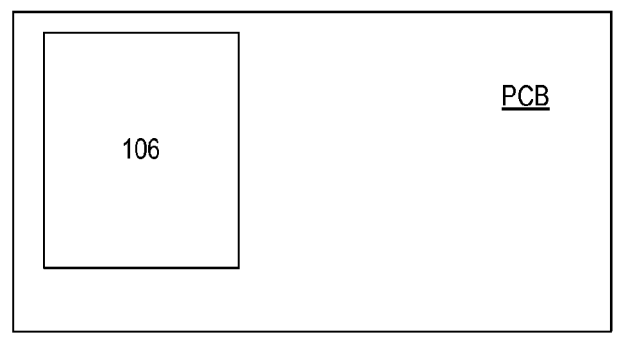

Referring now to FIG. 10A, an electrically conductive interconnection pattern 1002 is formed on a substrate such as a PCB. While FIGS. 10A-10D illustrate a PCB substrate, embodiments are not so limited; any electrically conductive interconnection pattern 1002 can be formed on any rigid or flexible substrate as described above. The electrically conductive interconnection pattern 1002 can be formed similarly as the antenna patterns 110, 120 described above. Referring now to FIG. 10B, one or more cuts 1004 are formed in the interconnection pattern 1002 using a suitable technique such as laser ablation, ion beam etching, or photolithography with chemical etching. Referring to FIGS. 10C-10D, following the formation of cuts 1004, one or more IPD chips 1006 are electrostatically transferred and bonded to the cut interconnection pattern 1002 similarly as described above with the micro RFID chips. In some embodiments, the IPD chips 1006 may have a maximum width or length dimension of 1 µm-300 µm, 1 µm-100 µm, or 1 µm-20 µm. In this manner, a large density of passive, and optionally active devices can be incorporated into a micro IPD chip for a variety of suitable applications. Then, depending upon the particular application, a generic interconnection pattern 1002 can be cut, and one or more micro IPD chips 1006 transferred and bonded to the cut interconnection pattern 1002 to achieve a tailored application where the cuts 1004 determine which passive and/or active devices are to be used (electrically active connection with the interconnection pattern 1002, and which passive and/or active devices will not be used (electrically inactive connection with, or isolated from, the interconnection pattern 1002). In this manner, a portion of the passive and/or active devices may be electrically active, while a portion of the passive and/or active devices are electrically inactive. Thus, a generic micro IPD chip 1006, and generic interconnection pattern 1002 can be used for specific tailor-made applications by cutting the interconnection pattern at specific locations, while maintaining a small form factor, reliable interconnection, and at low cost.

In utilizing the various aspects of this invention, it would become apparent to one skilled in the art that combinations or variations of the above embodiments are possible for integrating micro devices. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:
1. An RFID tag comprising:
a substrate;
a conductive antenna pattern including an antenna feed line that connects two terminal ends of the antenna pattern, and a line break in the antenna feed line, wherein the line break has a maximum width of 100 µm or less; and
a micro RFID chip bonded to the antenna feed line on opposite sides of the line break, wherein the micro RFID chip has a maximum length and width of 100 µm or less, and the RFID chip is bonded to the antenna feed line with solder bonds.

2. The RFID tag of claim 1, wherein the micro RFID chip has a maximum length and width of 20 µm or less.

3. The RFID tag of claim 2, wherein the line break has a maximum width of 20 µm or less.

4. The RFID tag of claim 2, wherein the conductive antenna pattern comprises aluminum or copper.

5. The RFID tag of claim 2, wherein the micro RFID chip includes a logic component node below 0.180 µm.

6. The RFID tag of claim 2, wherein an underfill encapsulation material is not located between the antenna pattern and the micro RFID chip.

7. The RFID tag of claim 2, wherein a stand-off bond pad height separating the micro RFID chip and antenna feed is approximately 3 µm or less.

8. The RFID tag of claim 1, wherein a stand-off bond pad height separating the micro RFID chip and antenna feed line is less than 50 µm.

9. A method of integrating a micro RFID chip comprising:
cutting an array of conductive patterns on a substrate to form an array of line breaks in the array of conductive patterns;
picking up an array of micro RFID chips from a carrier substrate with a corresponding array of electrostatic transfer heads of an electrostatic transfer head assembly, wherein each micro RFID chip has a maximum length and width of 100 µm or less; and
transferring thermal energy from the electrostatic transfer head assembly and through the array of micro RFID chips to bond the array of micro RFID chips to the array of conductive patterns on opposite sides of the corresponding line breaks with solder bonds.

10. The method of claim 9, wherein each micro RFID chip has a maximum length and width of 20 µm or less.

11. The method of claim 10, wherein each conductive pattern includes an antenna.

12. The method of claim 11, wherein the antenna is selected from the group consisting of a dipole antenna and looped antenna.

13. The method of claim 9, wherein each line break has a maximum width of 100 µm or less.

14. The method of claim 13, wherein cutting comprises laser ablation.

15. The method of claim 9, further comprising forming the array of conductive pattern on the substrates, wherein forming comprises a technique selected from the group consisting of lamination, screen printing, ink jet printing, and metal vapor deposition.

16. The method of claim 9, further comprising electrostatically transferring an array of micro LED devices to the array of conductive patterns, wherein each conductive pattern includes an electrode trace line.

* * * * *